(12) United States Patent
Kim et al.

(10) Patent No.: US 11,846,683 B2
(45) Date of Patent: Dec. 19, 2023

(54) METHOD FOR DETECTING INTERNAL SHORT-CIRCUITED CELL

(71) Applicant: Samsung SDI Co., Ltd., Yongin-si (KR)

(72) Inventors: Jake Kim, Yongin-si (KR); Yongjun Hwang, Yongin-si (KR); Giheon Kim, Yongin-si (KR); Christober Rayappan, Yongin-si (KR); Sungwook Paek, Yongin-si (KR); Byeonghui Lim, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 59 days.

(21) Appl. No.: 17/596,808

(22) PCT Filed: Feb. 5, 2020

(86) PCT No.: PCT/KR2020/001647
§ 371 (c)(1),
(2) Date: Dec. 17, 2021

(87) PCT Pub. No.: WO2020/262787
PCT Pub. Date: Dec. 30, 2020

(65) Prior Publication Data
US 2022/0268856 A1    Aug. 25, 2022

(30) Foreign Application Priority Data
Jun. 24, 2019    (KR) .................. 10-2019-0075224

(51) Int. Cl.
*G01R 31/00* (2006.01)
*G01R 31/52* (2020.01)
(Continued)

(52) U.S. Cl.
CPC ......... *G01R 31/52* (2020.01); *G01R 31/3842* (2019.01); *G01R 31/396* (2019.01)

(58) Field of Classification Search
CPC ...................................................... G01R 31/00
(Continued)

(56) References Cited

U.S. PATENT DOCUMENTS

| 8,334,699 B2 | 12/2012 | Asakura et al. |
| 10,333,180 B2 | 6/2019 | Seo et al. |

(Continued)

FOREIGN PATENT DOCUMENTS

| CN | 108562855 A | 9/2018 |
| JP | 2003-153436 A | 5/2003 |

(Continued)

OTHER PUBLICATIONS

Duong, Van-Huan, et al., "Online state of charge and model parameters estimation of the LiFePO₄ battery in electric vehicles using multiple adaptive forgetting factors recursive least-squares," Journal of Power Sources 296 (2015) 215-224.

(Continued)

*Primary Examiner* — Vincent Q Nguyen
(74) *Attorney, Agent, or Firm* — Lewis Roca Rothgerber Christie LLP

(57) ABSTRACT

An internal short-circuit cell detection method includes detecting a voltage and current of each of a plurality of battery cells, updating in real time G and H parameter values by using an adaptive filter, calculating a G parameter representative value, and calculating an H parameter representative value, and determining whether a short circuit occurs in each of the plurality of battery cells, based on the G and H parameter value of each of the plurality of battery cells, the G parameter representative value, and the H parameter representative value. The G parameter is a parameter indi- (Continued)

cating a sensitivity of a voltage to a change in current of each of the plurality of battery cells, and the H parameter is a parameter indicating an effective potential determined by a local equilibrium potential distribution and a resistance distribution in each of the plurality of battery cells.

13 Claims, 5 Drawing Sheets

(51) Int. Cl.
    *G01R 31/396*     (2019.01)
    *G01R 31/3842*     (2019.01)

(58) Field of Classification Search
    USPC .......................................... 324/426, 432–435
    See application file for complete search history.

(56) References Cited

U.S. PATENT DOCUMENTS

| | | | |
|---|---|---|---|
| 11,329,232 B2 | 5/2022 | Shin et al. | |
| 2011/0199054 A1 | 8/2011 | Burchardt et al. | |
| 2018/0083461 A1* | 3/2018 | Ravi | G06F 1/28 |
| 2020/0144603 A1* | 5/2020 | Si | H01M 4/386 |
| 2022/0196754 A1 | 6/2022 | Kim et al. | |

FOREIGN PATENT DOCUMENTS

| | | |
|---|---|---|
| KR | 10-2014-0106436 | 9/2014 |
| KR | 10-2017-0022758 | 3/2017 |
| KR | 10-1745167 | 6/2017 |
| KR | 10-2018-0095703 | 8/2018 |
| KR | 10-1887497 | 8/2018 |
| KR | 10-1901680 | 9/2018 |

OTHER PUBLICATIONS

Gao, Wenkai, et al., "Micro-Short-Circuit Diagnosis for Series-Connected Lithium-Ion Battery Packs Using Mean-Difference Model," IEEE Transaction on Industrial Electronics, vol. 66, No. 3, Mar. 2019, pp. 2132-2142.

Kim, Gi-Heon, et al., "Efficient and Extensible Quasi-Explicit Modular Nonlinear Multiscale Battery Model: GH-MSMD," Journal of the Electrochemical Society, 164 (6) A1076-A1088, 2017, 13 pages.

Ouyang, Minggao et al., "Internal short circuit detection for battery pack using equivalent parameter and consistency method," Journal of Power Sources 294 (2015) 272-283.

Seo, Minhwan, et al., "Detection of Internal Short Circuit in Lithium Ion Battery Using Model-Based Switching Model Method," Energies 2017, 10, 76; doi: 10.3390/en10010076, 13 pages.

Vahidi, A., et al., "Recursive least squares with forgetting for online estimation of vehicle mass and road grade: theory and experiments," Vehicle System Dynamics, vol. 43, No. 1, Jan. 2005, 31-55.

International Search Report for International Application No. PCT/KR2020/001647, dated May 19, 2020, 2 pages.

Extended European Search Report for Application No. PCT/KR2020001647, dated Jun. 6, 2023, 11 pages.

\* cited by examiner

METHOD FOR DETECTING INTERNAL SHORT-CIRCUITED CELL

CROSS-REFERENCE TO RELATED APPLICATION(S)

This application is a U.S. National Phase Patent Application of International Application Number PCT/KR2020/001647, filed on Feb. 5, 2020, which claims priority of Korean Patent Application Number 10-2019-0075224, filed on Jun. 24, 2019, the entire content of each of which is incorporated herein by reference.

TECHNICAL FIELD

The present disclosure relates to a method of accurately and rapidly detecting a battery cell in which an internal short circuit occurs from among battery cells that are being used.

BACKGROUND ART

Batteries have high applicability compared to other energy storage devices and have been widely used in electric vehicles (EVs) or hybrid electric vehicles (HEVs) driven by electric driving sources as well as portable devices due to characteristics such as relatively high energy and power density. In particular, when a strong output is required, a battery pack, in which a plurality of batteries are connected in series and in parallel, may also be used.

Battery management is significant for energy-efficient and safe use of batteries or battery-powered electrical devices, and to this end, accurate estimation and diagnosis of a state of a battery is essential. In particular, as a battery is used, an internal short circuit may occur between a positive electrode and a negative electrode of a battery cell. It is very important to rapidly and accurately detect the internal short circuit for the stable use of the battery.

In the related art, a correlation between measurable variables (e.g., current (I), voltage (V), and temperature (T)), and an internal state of a battery to be estimated is experimentally found in advance and then, the correlation is made in a table form, and the internal state of the battery such as resistance, capacitance, or an open circuit voltage (OCV) is estimated. Because internal states are affected by various variables, for accurate internal state estimation, a combination of various variables such as a state of charge (SOC) of a battery, current (I), voltage (V), and temperature (T) needs to be made and data needs to be collected for each of them. Accordingly, the higher accuracy is required, the more data is required, resulting in an increase in time and monetary costs. Also, such conventional methods have problems in that accuracy is unreliable because a battery should be stopped, specific conditions or environments should be satisfied, or sensor errors or estimation errors are accumulated.

DESCRIPTION OF EMBODIMENTS

Technical Problem

The present disclosure provides a method of accurately estimating in real time whether an internal short circuit occurs in each of battery cells by using a voltage value and a current value obtained by measuring a voltage and current of each of the battery cells that are being used, to overcome the drawbacks of conventional methods. The present disclosure provides a method of accurately and rapidly detecting a battery cell in which an internal short circuit occurs among battery cells, by using a G parameter and an H parameter indicating internal states of the battery cells. The present disclosure provides an internal short-circuit cell detection algorithm loadable into a battery management system (BMS).

Solution to Problem

According to an aspect of the present disclosure, an internal short-circuit cell detection method includes detecting a voltage and current of each of a plurality of battery cells that are electrically connected to one another between first and second terminals and are being used, to periodically generate a voltage value and a current value of each of the plurality of battery cells, updating in real time a G parameter value and an H parameter value obtained by digitizing a G parameter and an H parameter indicating a present state of each of the plurality of battery cells from the voltage value and the current value of each of the plurality of battery cells, by using an adaptive filter, calculating a G parameter representative value representing the G parameter values of the plurality of battery cells, and calculating an H parameter representative value representing the H parameter values of the plurality of battery cells, and determining whether a short circuit occurs in each of the plurality of battery cells, based on the G parameter value and the H parameter value of each of the plurality of battery cells, the G parameter representative value, and the H parameter representative value. The G parameter is a parameter indicating a sensitivity of a voltage to a change in current of each of the plurality of battery cells, and the H parameter is a parameter indicating an effective potential determined by a local equilibrium potential distribution and a resistance distribution in each of the plurality of battery cells.

Advantageous Effects of Disclosure

An internal short-circuit cell detection method according to various embodiments of the present disclosure is greatly improved over conventional methods in terms of cost, scalability, and adaptability. In particular, because the internal short-circuit cell detection method is not an estimation method based on estimates such as an existing experimental model, but estimates internal states of a battery by using values that may be directly measured, the internal short-circuit cell detection method has higher accuracy than conventional methods. In addition, the internal short-circuit cell detection method of the present disclosure may be loaded as an algorithm into a data battery management system (BMS).

BEST MODE

Figure 1:
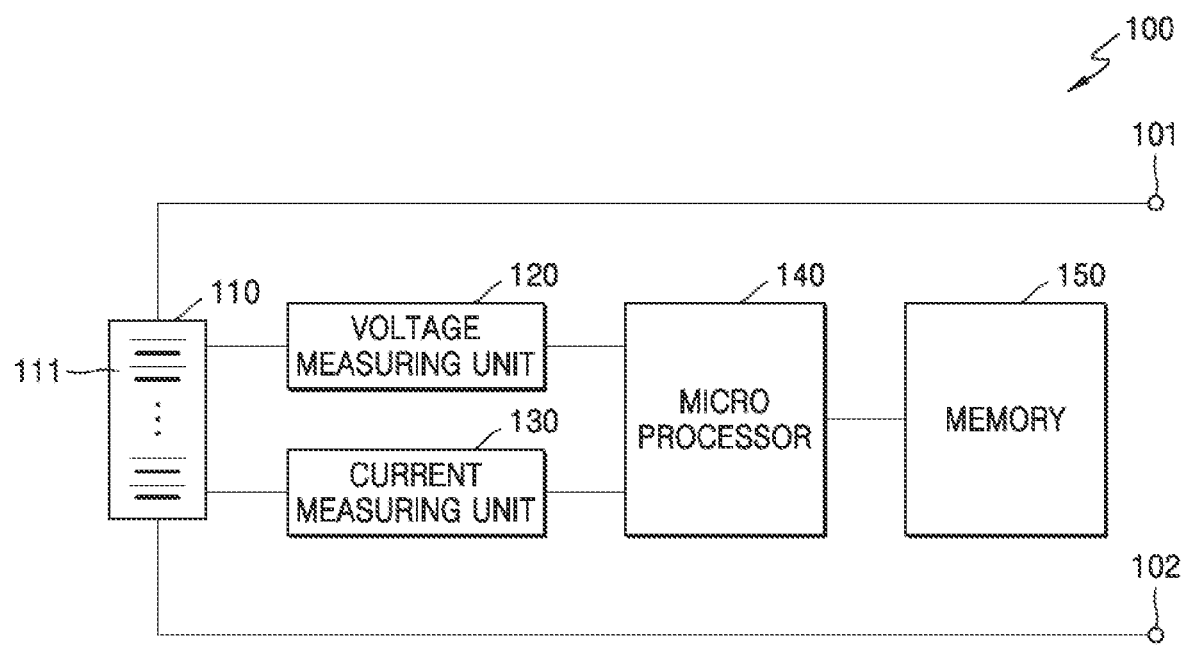
FIG. 1 illustrates a configuration of a battery system for performing an internal short-circuit cell detection method, according to an embodiment.

The advantages and features of the present disclosure, and methods of achieving the same, will become apparent with reference to embodiments of the disclosure described below in detail in conjunction with the accompanying drawings. However, the present disclosure is not limited to embodiments presented below but may be embodied in various different forms, and it is to be appreciated that all changes, equivalents, and substitutes that do not depart from the spirit and technical scope of the present disclosure are encompassed in the present disclosure. Rather, these embodiments are provided so that this disclosure will be thorough and complete, and will fully convey the scope of the present disclosure to one of ordinary skill in the art. In the description of the present disclosure, certain detailed explanations of the related art are omitted when it is deemed that they may unnecessarily obscure the essence of the present disclosure.

The terms used in the present application are merely used to describe specific embodiments, and are not intended to limit the present disclosure. The singular forms "a" "an," and "the" are intended to include the plural forms as well, unless the context clearly indicates otherwise. Further, as used in this application, the terms "include," "have" and their conjugates may be construed to denote a certain feature, number, step, operation, constituent element, component, or a combination thereof, but may not be construed to exclude the existence or addition of one or more other features, numbers, steps, operations, constituent elements, components, or combinations thereof. It will be understood that although the terms "first," "second," etc. may be used herein to describe various components, these components should not be limited by these terms. These terms are only used to distinguish one component from another.

Hereinafter, embodiments of the present disclosure will be described in detail with reference to the accompanying drawings, wherein the same or corresponding elements throughout are denoted by the same reference numerals and a repeated description thereof is omitted.

FIG. 1 illustrates a configuration of a battery system for performing an internal short-circuit cell detection method, according to an embodiment.

Referring to FIG. 1, a battery system 100 may include a battery 110, a voltage measuring unit 120, a current measuring unit 130, a microprocessor 140, and a memory 150.

The battery 110 for storing power includes a plurality of battery cells 111 that are electrically connected between a first terminal 101 and a second terminal 102. The battery cells 111 may be connected in series, may be connected in parallel, or may be connected in a combination of the two. The battery cells 111 may have the same capacity and may discharge and charge current of the same size. However, in factor, internal states of the battery cells 111 may be different from one another. For example, the battery cells 111 may have different internal resistances and electromotive forces. The battery cells 111 may have different G parameter values and H parameter values.

Each of the battery cells 111 may include a rechargeable secondary battery. For example, the battery cell 111 may include a nickel-cadmium battery, a lead storage battery, a nickel metal hydride (NiMH) battery, a lithium ion battery, or a lithium polymer battery. The number of battery cells 111 constituting the battery 110 may be determined according to a capacity, an output voltage, and output current required for the battery 110.

Although one battery 110 is illustrated in FIG. 1, a plurality of batteries 110 may be connected in parallel and/or in series, and may be connected to a load and/or a charging device through the first and second terminals 101 and 102. Although not shown in FIG. 1, the battery 110 connected to the load and/or the charging device is being used, That is, the battery 110 may be discharged by supplying current to the load, or may be charged by receiving power from the charging device.

The voltage measuring unit 120 may be connected to both terminals of each of the battery cells 111 that are being used and may measure a voltage of each of the battery cells 111 to periodically generate a voltage value of each of the battery cells 111. When the battery cells 111 are connected in parallel, because the battery cells 111 connected in parallel have the same voltage, the voltage measuring unit 120 may measure only a voltage of one battery cell 111.

The voltage measuring unit 120 may measure a voltage each of the battery cells 111 in a preset time period $\Delta t$. The time period $\Delta t$ may be, for example, 1 second. The time period $\Delta t$ may be set to another time, for example, 0.1 seconds, 0.5 seconds, 2 seconds, 5 seconds, or 10 seconds. The time period $\Delta t$ may be appropriately set according to an electrical system connected to the battery system 100.

A currently or recently measured voltage value is referred to as a present voltage value and is denoted by $V(t)$. A voltage value measured before the time period $\Delta t$ is referred to as an immediately preceding voltage value, and is denoted by $V(t-1)$.

Voltage values of the battery cells 111 may be different from one another according to internal states of the battery cells 111. A present voltage value and an immediately preceding voltage value of a $j^{th}$ battery cell 111 are respectively denoted by $V\_j(t)$ and $V\_j(t-1)$. Here, j may indicate a number of the battery cell 111, and may be equal to or less than the total number of the battery cells 111 included in the battery 110.

The current measuring unit 130 may measure current of each of the battery cells 111 that are being used to periodically generate a current value of each of the battery cells 111. When the battery cells 111 are connected in series, because the battery cells 111 connected in series have the same current, the current measuring unit 130 may measure only current of one battery cell 111.

The voltage measuring unit 120 and the current measuring unit 130 may be synchronized with each other and may measure a voltage and current of each of the battery cells 111 at the same time. The current measuring unit 130 may measure current of each of the battery cells 111 in the time period $\Delta t$. A current value measured by the current measuring unit 130 may be displayed positive (+) when it is charging current and may be displayed negative (−) when it is discharging current. A currently or recently measured current value is referred to as a present current value and is denoted by $I(t)$, and a current value measured before the time period $\Delta t$ is referred to as an immediately preceding current value and is denoted by $I(t-1)$.

Current values of the battery cells 111 may be different from one another according to internal states of the battery cells 111. A present current value and an immediately preceding current value of the $j^{th}$ battery cell 111 are respectively denoted by $I\_j(t)$ and $I\_j(t-1)$.

The microprocessor 140 may update in real time a G parameter value and an H parameter value obtained by digitizing a G parameter and an H parameter respectively indicating a present state of each of the battery cells 111 from a voltage value of each of the battery cells 111 provided by the voltage measuring unit 120 and a current value of each of the battery cells 111 provided by the current measuring unit 130. The G parameter is a parameter indicating a sensitivity of a voltage to a current change of the battery cell 111 that is being used, and the H parameter is a parameter indicating an effective potential determined by a local equilibrium potential distribution and a resistance distribution in the battery cell 110 that is being used. The G parameter and the H parameter of the $j^{th}$ battery cell 111 are respectively denoted by G_j and H_j.

A G parameter value and an H parameter value of each of the battery cells 111 may be generated in real time from a voltage value and a current value of each of the battery cells 111 by using an adaptive filter. A G parameter value and an H parameter value of the $j^{th}$ battery cell 111 are respectively denoted by G_j(t) and H_j(t).

The microprocessor 140 may use an adaptive filter to generate a G parameter value and an H parameter value of each of the battery cells 111. The adaptive filter may be a filter using a recursive least squares (RLS) method or a filter using a weighted least squares (VEILS) method. An embodiment in which the microprocessor 140 uses an RLS filter will now be described in detail.

The microprocessor 140 may identify an internal short-circuit cell in which an internal short circuit occurs among the battery cells 111, by using the G parameter value and the H parameter value of each of the battery cells 111. The term 'internal short-circuit cell' refers to a battery cell in which physical direct contact occurs between a positive electrode and a negative electrode. When a battery cell is used for a long time in a high temperature environment or an external impact occurs, an internal short circuit may occur in the battery cell. An internal short circuit may occur in a progressive manner, or an internal short circuit may occur and then may disappear in a battery cell according to an external environment. In the present specification, a battery cell in which an internal short circuit occurs is referred to as an internal short-circuit cell or an internal short-circuit battery cell.

According to an embodiment, the microprocessor 140 may calculate a G parameter representative value from the G parameter value of each of the battery cells 111. The G parameter representative value may be determined to be a value that may represent G parameters. For example, the G parameter representative value may be an average value or a median value of the G parameter values.

The microprocessor 140 may calculate an H parameter representative value from the H parameter value of each of the battery cells 111. The H parameter representative value may be determined to be a value that may represent H parameters. For example, the H parameter representative value may be an average value or a median value of the H parameter values.

The microprocessor 140 may determine whether an internal short circuit occurs in each of the battery cells 111, by using the G parameter value of each of the battery cells 111, the H parameter value of each of the battery cells 111, the G parameter representative value, and the H parameter representative value.

Because the microprocessor 140 uses only four simple arithmetic operations to detect an internal short-circuit cell, the microprocessor 140 may be included in a battery management system (BMS) of a battery pack. According to another example, an internal short-circuit cell detection method according to the present embodiment may be performed by a microcontroller or an electronic control unit (ECU) in a BMS of an electric vehicle. According to another example, an internal short-circuit cell detection method according to the present embodiment may be performed by an integrated controller of an energy storage system. According to another example, an internal short-circuit cell detection method according to the present embodiment may be performed by a processor of a server communicating with the battery system or the energy storage system.

The memory 150 may store instructions and data required to perform an internal short-circuit cell detection method according to the present embodiment. According to the present embodiment, because a G parameter value and an H parameter value of each of the battery cells 111 are generated based on a voltage value and a current value of each of the battery cells 111 generated in every time period Δt and an internal short-circuit cell is detected based on the G parameter value and the H parameter value of each of the battery cells 111, a present voltage value, a present current value, and an immediately preceding current value of each of the battery cells 111 may be stored in the memory 150, and other voltage and current data may not need to be stored in the memory 150. That is, the memory 150 does not need to store a large amount of voltage and current data.

According to an internal short-circuit cell detection method of the present embodiment, an immediately preceding value and a present value of a state vector including a G parameter and an H parameter of each of the battery cells 111, and an immediately preceding value and a present value of a covariance matrix required for the calculation of an RLS method may be stored in the memory 150. A G parameter representative value and an H parameter representative value may be stored in the memory 150. Because the memory 150 does not need to store a large amount of instructions and data, the memory 150 may be implemented as a memory having a small size. For example, the memory 150 may be implemented as a memory inside the microprocessor 140.

Examples of an important estimate indicating a present state of a battery include a battery state of charge (SOC), a battery state of health (SOH), and a battery state of power capability (SOP). Conventional battery internal state estimation methods involve experimentally finding in advance a correlation between measurable variables (e.g., current (I), voltage (V), and temperature (T)) and an internal state of a battery cell to be estimated, making the correlation in a table form, and estimating the internal state of the battery cell such as internal resistance, internal capacitance, or an opening circuit voltage (OCV). Such battery state estimation methods have drawbacks in terms of cost, scalability, and adaptability.

According to the conventional battery internal state estimation methods, data should be collected through experiments in advance, and battery internal states are estimated based on the collected data. Because the internal states are affected by various variables, for accurate internal state estimation, a combination of various variables such as a state of charge (SOC) of a battery, current (I), voltage (V), and temperature (T) needs to be made and data needs to be collected for each of them. Accordingly, the higher accuracy is required, the more data is required, resulting in an increase in time and monetary costs. In addition, when an internal state is estimated by performing extrapolation on a value exceeding a range of variables measured in experiments, it may be difficult to rely on an estimate. Also, when an internal state estimated through experiments is not accurate, the utilization of the estimated internal state decreases. A method of experimentally finding a correlation in advance and using the correlation for state variable estimation also has similar problems.

In order to extract state information of a battery pack, experimental data about the battery pack is required. However, due to high cost required to collect the experimental data of the battery pack, in general, the state information of the battery pack is estimated by using data measured in a battery cell. However, this method is based on the assumption that a relationship between variables measured in the battery cell is a scalable mechanism to a larger system such as the battery pack. Accordingly, unless additional verification is performed to prove the scalability of the mechanism between systems in advance, the reliability and accuracy of the state information of the battery pack estimated in the above manner may be questioned.

Conventional internal state estimation has poor adaptability. Batteries have different characteristics over time. This is referred to as an aging effect. Due to the aging effect, a correlation between measurable variables such as voltage (V), current (I), and temperature (T) of a battery and an internal state changes over time. However, when a table that summarizes the correlation between the internal state and the variables measurable through experiments in advance is completed, it is difficult to reflect the aging effect. In order to reflect the aging effect, many experiments on the aging effect should be performed in advance, or the aging effect should be predicted and reflected in an experimental model in advance. However, the former has a problem in that cost increases, and the latter has a problem in that when the aging effect is not accurately predicted in advance, the reliability of a state estimate is poor. Not only time but also a design change of a battery cell may cause changes in characteristics of the battery cell. However, when these changes are not predicted and reflected in the experimental model in advance, if a design change of the battery cell such as an active material used in the battery cell or a shape of the battery cell occurs in the future, the existing experimental model may not be used.

An internal state of a battery may also be estimated by using an electrochemical model (e.g., Newman's model) considering electrochemical phenomena and thermal behaviors in the battery. The use of the electrochemical model has an advantage in that a physical state that is difficult to directly measure may be used as a control parameter of a BMS. However, because the electrochemical mod& has a disadvantage in that development time and cost are excessively required and resources required for calculation are too large, it is difficult to utilize the electrochemical model the BMS.

In order to solve such problems of conventional methods, the present disclosure provides a method of distinguishing a normal battery cell from an internal short-circuit cell by using a G parameter and an H parameter that are parameters indicating a present state of a battery cell. The internal short-circuit cell detection method according to the present disclosure may be performed relatively simply enough to be used in a BMS and may have high accuracy even without additional operating conditions.

A G parameter is a state amount indicating a sensitivity of a terminal voltage of a battery cell to a change in current applied to a battery cell that is being used, and has a unit of resistance. An H parameter is an effective potential determined by a local equilibrium potential distribution and a resistance distribution in the battery cell that is being used. The G parameter and the H parameter of the battery cell may be quantized by an explicit correlation between battery material properties and design variables by using a theoretical model. The G parameter and the H parameter of the battery cell will now be described.

It may be assumed that, in the battery cell, a voltage V and current i have a relationship such as $V=f(i; x, p)$. Here, x is a physical amount indicating an internal state of the battery cell, and p is a parameter.

When a function f that is a nonlinear implicit function may be divided into a rapidly changing amount g and a slowly changing amount h, the above relationship equation may be expressed as $V=g(i; x, p)+h(i; x, p)$.

When it is assumed that there is a function $G(i; x, p)=dg/di$ that slowly changes with respect to the current i, the above relationship equation may be expressed as $V=G(i; x, p)i+H(i; x, p)$.

In the above relationship equation, dG/di and dH/di have very small values. In other words, when the above assumptions are satisfied. G and H are functions that slowly change with respect to the current i, and thus the function f indicating a nonlinear relationship between the voltage V and the current i may be expressed in a quasi-linear relationship.

Here, G is referred to as a G parameter, and H is referred to as an H parameter. When the current i is charging/discharging current and Ueq is an equilibrium potential of the battery cell, a discharging overvoltage may be expressed as $Ueq-V=-G \cdot i$ (Ueq-H) by using the G parameter G and the H parameter H.

Here, $-G \cdot i$ is an overvoltage generated by the battery cell to flow current through a terminal, and includes a reaction dynamic polarization amount and an electron and ion resistance polarization amount, (Ueq-H) is an overvoltage generated when a local thermodynamic equilibrium state of the battery cell deviates from an overall system equilibrium state. That is, (Ueq-H) indicates inefficiency caused by thermodynamic non-uniformity inside the battery cell, and when an internal system of the battery cell reaches the thermodynamic equilibrium state, the H parameter H is equal to the equilibrium potential Ueq.

An internal short-circuit cell detection method according to embodiments of the present disclosure involves extracting a G parameter G and an H parameter H of each of battery cells directly from a voltage value and a current value measured in each of the battery cells by using, for example, an RLS method, and detecting an internal short-circuit cell by using the G parameter G and the H parameter H of each of the battery cells.

Figure 2:
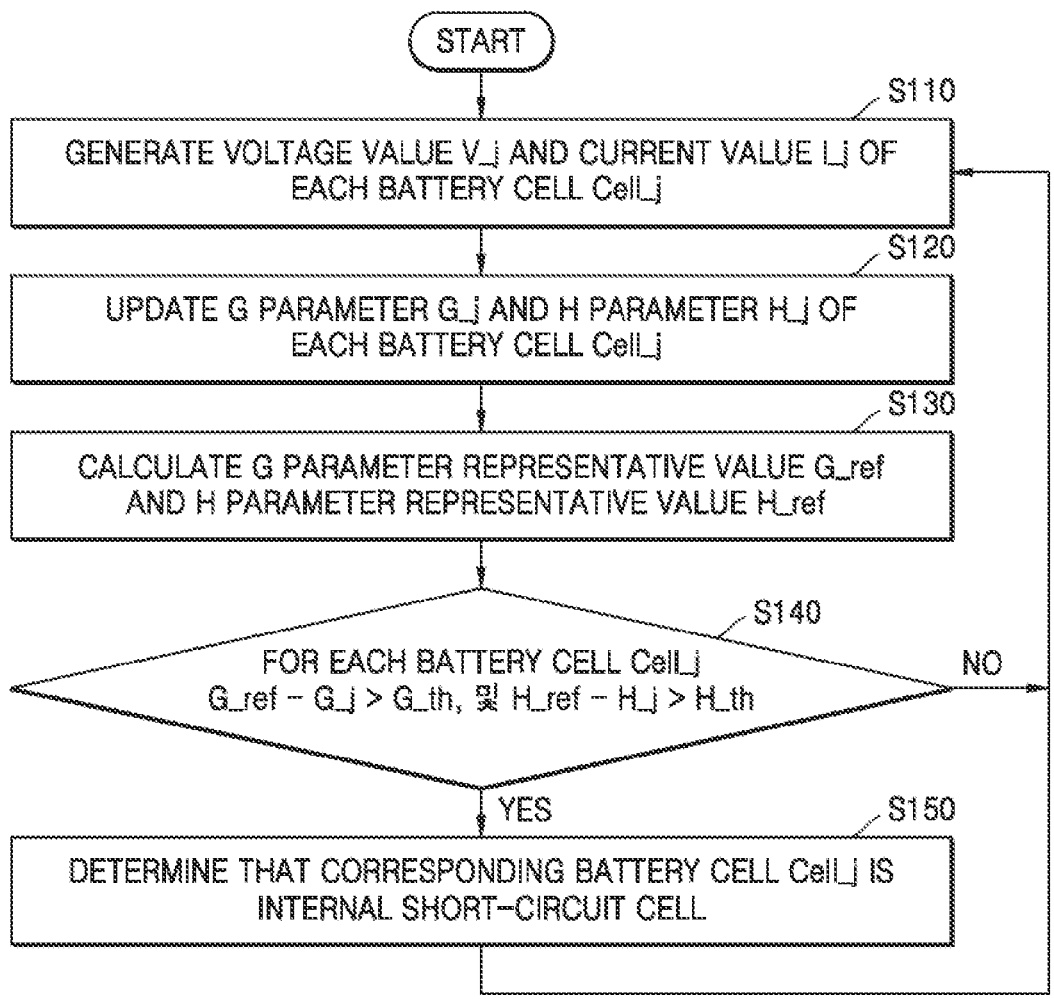
FIG. 2 is a flowchart illustrating an internal short-circuit cell detection method, according to an embodiment.

FIG. 2 is a flowchart illustrating an internal short-circuit cell detection method, according to an embodiment.

Referring to FIGS. 1 and 2, the microprocessor 140 may perform an internal short-circuit cell detection method of FIG. 2 by using an adaptive filter.

The microprocessor 140 may detect a voltage and current of each of the plurality of battery cells 111 that are electrically connected to one another between the first and second terminals 101 and 102 and are being used, by using the voltage measuring unit 120 and the current measuring unit 130. The microprocessor 140 may periodically generate a voltage value V and a current value I of each of the battery cells 111 (S110). A voltage value V_j and a current value I_j of a $j^{th}$ battery cell (e.g., Cell_j) may be generated. The $j^{th}$ battery cell (e.g., Cell_j) refers to any one of the battery cells 111 included in the battery 110, and j is equal to or greater than 1 and may be equal to or less than the number of battery cells 111 included in the battery 110.

The microprocessor 140 may update in real time a G parameter value G_j(t) and an H parameter value H_j(t) obtained by digitizing a G parameter and an H parameter indicating a present state of each (e.g., Cell_j) of the battery cells from the voltage value V_j and the current value I_j of each (e.g., Cell_j) of the battery cells by using the adaptive filter stored in the memory 150 (S120). Operation S120 in which the G parameter value G_j(t) and the H parameter value H_j(t) are updated in real time will now be described in more detail.

The microprocessor 140 may calculate a G parameter representative value G_ref representing G parameter values G(t) of the battery cells 111, and may calculate an H parameter representative value H_ref representing H parameter values H(t) of the battery cells 111 (S130). According to an embodiment, the G parameter representative value G_ref may be an average value of the G parameter values G(t), and the H parameter representative value H_ref may be an average value of the H parameter values H(t), According to another embodiment, the G parameter representative value G_ref may be a median value of the G parameter values G(t), and the H parameter representative value H_ref may be a median value of the H parameter values H(t).

The microprocessor 140 may determine whether each (e.g., Cell_j) of the battery cells is an internal short-circuit cell, based on the G parameter value G_j(t) and the H parameter value H_j(t) of each (e.g., Cell_j) of the battery cells, the G parameter representative value G_ref, and the H parameter representative value H_ref. For example, for each (e.g., Cell_j) of the battery cells, the microprocessor 140 may calculate a G parameter deviation value G_ref−G_j(t) of each battery cell (e.g., Cell_j) by subtracting the G parameter value G_j(t) of each battery cell (e.g., Cell_j) from the G parameter representative value G_ref, and may calculate an H parameter deviation value H_ref−H_j(t) of each battery cell (e.g., Cell_j) by subtracting the H parameter value H_j(t) of each battery cell (e.g., Cell_j) from the H parameter representative value H_ref. The microprocessor 140 may determine whether the G parameter deviation value G_ref−G_j(t) of each battery cell (e.g., Cell_j) is greater than a preset G parameter setting value G_th, and may determine whether the H parameter deviation value H_ref−H_j(t) of each battery cell (e.g., Cell_j) is greater than a preset H parameter setting value H_th (S140).

When the G parameter deviation value G_ref−G_j(t) of each battery cell (e.g., Cell_j) is greater than the preset G parameter setting value G_th and the H parameter deviation value H_ref−H_j(t) of each battery cell (e.g., Cell_j) is greater than the preset H parameter setting value H_th, the microprocessor 140 may determine that the battery cell (e.g., Cell_j) is an internal short-circuit cell (S150). For example, the G parameter setting value G_th may be previously set to about 0.1, and the H parameter setting value H_th may be previously set to about 0.01. These values are examples, and the G parameter setting value G_th and the H parameter setting value H_th may be set to other values according to characteristics of the battery cells 111.

When the G parameter value G_j(t) and the H parameter value H_j(t) of the battery cell (e.g., Cell_j) do not satisfy conditions of operation S140, the microprocessor 140 may determine whether another battery cell (e.g., Cell_k) satisfies the conditions of operation S140 to determine whether the battery cell Cell_k is an internal short-circuit cell. In this way, the microprocessor 140 may determine whether an internal short circuit occurs in each of all of the battery cells 111 in the battery 110.

When all of the battery cells 111 do not satisfy the conditions of operation S140, the microprocessor 140 may not proceed to operation S110, The microprocessor 140 may rapidly and accurately determine whether an internal short circuit occurs in each of the battery cells 111, by repeatedly performing operations S110 through S140 after a preset time period Δt.

According to an embodiment, the microprocessor 140 may perform operations of FIG. 2 by using an RLS filter stored in the memory 150.

Figure 3:
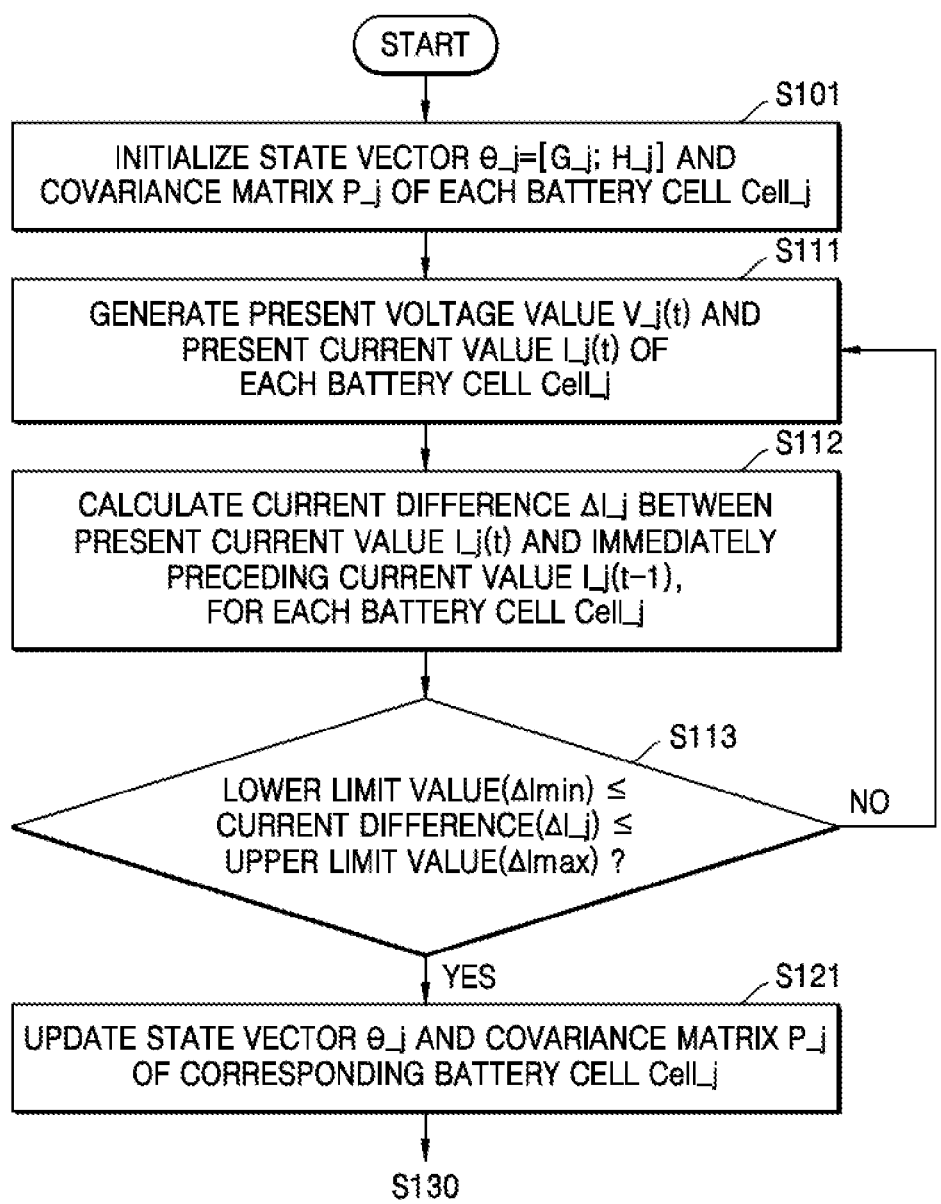
FIG. 3 is a detailed flowchart illustrating some operations of the internal short-circuit cell detection method of FIG. 2.

FIG. 3 is a flowchart illustrating operations S110 through S120 of the internal short-circuit cell detection method of FIG. 2.

Referring to FIGS. 1 through 3, when the microprocessor 140 uses an RLS filter, the microprocessor 140 may initialize a state vector Θ=[G; H] and a covariance matrix P of each of the battery cells 111 (S101). According to the present embodiment, there may exist a state vector Θ_j=[G_j; H_j] and a covariance matrix P_j corresponding to the $j^{th}$ battery cell Cell_j. In operation S101, the microprocessor 140 may initialize the state vector Θ_j=[G_j; H_j] and the covariance matrix P_j of the $j^{th}$ battery cell (e.g., Cell_j).

Operation S110 of FIG. 2 may include operations S111, S112, and S113 of FIG. 3. In operation S111, the microprocessor 140 may generate a present voltage value V(t) and a present current value I(t) of each of the battery cells 111. The present voltage value V(t) and the present current value I(t) of each of the battery cells 111 generated before the time period Δt are an immediately preceding voltage value V(t−1) and an immediately preceding current value I(t−1) of each of the battery cells 111. For example, the microprocessor 140 generates an immediately preceding voltage value V_j(t−1) and an immediately preceding current value I_j(t−1) of the $j^{th}$ battery cell (e.g., Cell_j), and generates a present voltage value V_j(t) and a present current value I_j(t) of the $j^{th}$ battery cell (e.g., Cell_j) after the time period Δt.

In operation S112, the microprocessor 140 may calculate a current difference ΔI between the present current value I(t) and the immediately preceding current value I(t−1) for each of the battery cells 111. For example, the microprocessor 140 may calculate a current difference ΔI_j between the present current value I_j(t) and the immediately preceding current value I_j(t−1), for the $j^{th}$ battery cell (e.g., Cell_j).

In operation S113, the microprocessor 140 may compare the current difference ΔI of each of the battery cells 111 with a preset range. The preset range may be defined by using a lower limit value ΔImin and an upper limit value ΔImax. For example, the microprocessor 140 may determine whether the current difference ΔI_j of the $j^{th}$ battery cell (e.g., Cell_j) is between the lower limit value ΔImin and the upper limit value ΔImax.

When the current difference ΔI_j of the $j^{th}$ battery cell (e.g., Cell_j) is between the lower limit value ΔImin and the upper limit value ΔImax, in operation S121, the state vector Θ_j and the covariance matrix P_j of the $j^{th}$ battery cell (e.g., Cell_j) may be updated. The state vector Θ_j of the $j^{th}$ battery cell (e.g., Cell_j) includes the G parameter value G_j(t) and the H parameter value H_j(t) of the $j^{th}$ battery cell (e.g., Cell_j), and when the state vector Θ_J is updated in operation S121, the G parameter value G_j(t) and the H parameter value H_j(t) are also updated (S120).

Next, the microprocessor 140 may perform operation S130 of FIG. 2.

According to the present embodiment, a state vector $\hat{Θ}(t)$ and a covariance matrix P(t) are used. A method of updating in real time the G parameter value G_j(t) and the H parameter value H_j(t) of any one battery cell (e.g., Cell_j) from among the battery cells 111 will now be described. Because a G parameter value G_k(t) and an H parameter value H_k(t) are calculated in the same way for another battery cell (e.g., Cell_j), a number (e.g., j or k) for identifying each of the battery cells 111 is omitted.

The state vector $\hat{Θ}(t)$ includes a G parameter $\hat{G}(t)$ and an H parameter $\hat{H}(t)$, and may be defined as $$\hat{\Theta}(t) = \begin{bmatrix} \hat{G}(t) \\ \hat{H}(t) \end{bmatrix}.$$

The covariance matrix P(t) includes a first value $P_1(t)$ and a second value $P_2(t)$, and may be defined as $$P(t) = \begin{bmatrix} P_1(t) \\ P_2(t) \end{bmatrix}.$$

The voltage value V(t) and the current value I(t) of the battery cell 111 are generated in every time period $\Delta t$, and the state vector $\hat{\Theta}(t)$ and the covariance matrix P(t) are also updated in every time period $\Delta t$ by using a recursive method. The G parameter $\hat{G}(t)$ and the H parameter $\hat{H}(t)$ are also updated in every time period $\Delta t$.

The microprocessor 140 may initialize the state vector $\hat{\Theta}(t)$ and the covariance matrix P(t) in operation S101. For example, the state vector $\hat{\Theta}(t)$ may be initialized as in $$\hat{\Theta}(0) = \begin{bmatrix} \hat{G}(0) \\ \hat{H}(0) \end{bmatrix} = \begin{bmatrix} 1 \\ 1 \end{bmatrix},$$

and the covariance matrix P(t) may be initialized as in $$P(0) = \begin{bmatrix} P_1(0) \\ P_2(0) \end{bmatrix} = \begin{bmatrix} 1 \\ 1 \end{bmatrix}.$$

In the present example, although elements of the state vector $\hat{\Theta}(t)$ and elements of the covariance matrix P(t) are all initialized to 1, this is an example and the elements may be initialized to other values.

The microprocessor 140 may measure a voltage and current of each of the battery cells 111 by using the voltage measuring unit 120 and the current measuring unit 130, and may generate a voltage value and a current value of each of the battery cells 111 periodically, for example, in every time period $\Delta t$. The microprocessor 140 may generate the immediately preceding voltage value V(t−1) and the immediately preceding current value I(t−1) of each of the battery cells 111, and may generate the present voltage value V(t) and the present current value I(t) of each of the battery cells 111 after the time period $\Delta t$.

The microprocessor 140 may update the G parameter $\hat{G}(t)$ and the H parameter $\hat{H}(t)$ in every time period $\Delta t$ by using the present voltage value V(t) and the present current value I(t) generated in every time period $\Delta t$ by using an RLS method.

The microprocessor 140 may calculate a present voltage estimate $\hat{V}(t)$ of the battery cell 111 based on the present current value I(t) and an immediately preceding value $\hat{\Theta}(t-1)$ of the state vector. The immediately preceding value $\hat{\Theta}(t-1)$ of the state vector is calculated based on the immediately preceding voltage value V(t−1) and the immediately preceding current value I(t−1) before the time period $\Delta t$, and includes an immediately preceding value $\hat{G}(t-1)$ of the G parameter and an immediately preceding value $\hat{H}(t-1)$ of the H parameter. The present voltage estimate $\hat{V}(t)$ of the battery cell 111 may be calculated as $\hat{V}(t)=I(t)\hat{G}(t-1)+\hat{H}(t-1)$, by adding the immediately preceding value $\hat{H}(t-1)$ to a product of the present current value I(t) and the immediately preceding value $\hat{G}(t-1)$ of the G parameter.

The microprocessor 140 may update a gain matrix L(t) based on the present current value I(t) and an immediately preceding value P(t−1) of the covariance matrix. The immediately preceding value P(t−1) of the covariance matrix is calculated based on the immediately preceding voltage value V(t−1) and the immediately preceding current value I(t−1) before the time period $\Delta t$, and includes a first immediately preceding value $P_1(t-1)$ of the covariance matrix and a second immediately preceding value $P_2(t-1)$ of the covariance matrix according to definition of the covariance matrix P(t). The gain matrix L(t) exists to correspond to each of the battery cells 111.

The gain matrix L(t) is used when the state vector $\hat{\Theta}(t)$ and the covariance matrix P(t) are updated. The gain matrix L(t) includes a first value $L_1(t)$ of the gain matrix and a second value $L_2(t)$ of the gain matrix, and may be calculated as follows.

$$L(t) = \begin{bmatrix} L_1(t) \\ L_2(t) \end{bmatrix} = \frac{1}{1 + P_1(t-1)I(t)^2/\lambda_1 + P_2(t-1)/\lambda_2} \begin{bmatrix} P_1(t-1)I(t)/\lambda_1 \\ P_2(t-1)/\lambda_2 \end{bmatrix}$$

Here, $\lambda_1$ is a first forgetting factor, and is related to the G parameter. $\lambda_2$ is a second forgetting factor, and is related to the H parameter. The first forgetting factor $\lambda_1$ and the second forgetting factor $\lambda_2$ are values in which, when the G parameter $\hat{G}(t)$ and the H parameter $\hat{H}(t)$ are calculated, the effect of a past voltage value and a past current value on a present value $\hat{G}(t)$ of the G parameter and a present value $\hat{H}(t)$ of the H parameter is indicated. As being closer to 1, the first forgetting factor $\lambda_1$ and the second forgetting factor $\lambda_2$ affect the present value $\hat{G}(t)$ of the G parameter and the present value of the $\hat{H}(t)$ of the H parameter for a long time, and as being closer to 0, the first forgetting factor $\lambda_1$ and the second forgetting factor $\lambda_2$ affect the present value of the G parameter and the present value $\hat{H}(t)$ of the H parameter only for a short time.

According to an embodiment, the first forgetting factor $\lambda_1$ and the second forgetting factor $\lambda_2$ may be equal to or greater than 0.9 and equal to or less than 1. According to another embodiment, the first forgetting factor $\lambda_1$ may be set to be equal to or greater than the second forgetting factor $\lambda_2$. For example, the first forgetting factor $\lambda_1$ may be set to 0.99999, and the second forgetting factor $\lambda_2$ may be set to 0.95. These setting values may vary according to characteristics of the battery cell 111.

The inventors of the present disclosure have found that, in an experiment performed on a specific battery cell, high reliability results were derived when the first forgetting factor $\lambda_1$ and the second forgetting factor $\lambda_2$ were respectively 0.99999 and 0.95. However, the above values are examples, and other values may be set according to characteristics of the battery cell 111. For example, the first forgetting factor $\lambda_1$ may be set to 0.9999, and the second forgetting factor $\lambda_2$ may be set to 0.98.

In another example, both the first forgetting factor $\lambda_1$ and the second forgetting factor $\lambda_2$ may be set to 1. In this case, it may be regarded that the first forgetting factor $\lambda_1$ and the second forgetting factor $\lambda_2$ were not applied.

The microprocessor 140 may update the covariance matrix P(t) based on the present current value I(t), the gain matrix L(t), and the immediately preceding value P(t−1) of the covariance matrix. The covariance matrix P(t) may be calculated as follows.

$$P(t) = \begin{bmatrix} P_1(t) \\ P_2(t) \end{bmatrix} = \begin{bmatrix} \{1 - L_1(t)I(t)\}P_1(t-1)/\lambda_1 \\ \{1 - L_2(t)\}P_2(t-1)/\lambda_2 \end{bmatrix}$$

The microprocessor 140 may calculate a voltage error e(t) between the present voltage value V(t) and the present voltage estimate $\hat{V}(t)$ calculated earlier, as e(t)=V(t)−$\hat{V}(t)$.

The microprocessor 140 may update the state vector $\hat{\Theta}(t)$ based on the immediately preceding value $\hat{\Theta}(t-1)$ of the state vector, the present value L(t) of the gain matrix, and the voltage error e(t). As the state vector $\hat{\Theta}(t)$ is updated, the present value $\hat{G}(t)$ of the G parameter and the present value $\hat{H}(t)$ of the H parameter are generated.

The present value $\hat{\Theta}(t)$ of the state vector may be calculated by adding a product of the present value L(t) of the gain matrix and the voltage error e(t) to the immediately preceding value $\hat{\Theta}(t-1)$ of the state vector as follows.

$$\hat{\Theta}(t) = \begin{bmatrix} \hat{G}(t) \\ \hat{H}(t) \end{bmatrix} = \hat{\Theta}(t-1) + L(t) \times e(t)$$

The above equation in which the state vector $\hat{\Theta}(t)$ is recursively expressed may be derived as follows.

First, a loss-function ε to which the first forgetting factor $\lambda_1$ and the second forgetting factor $\lambda_2$ are applied is defined as follows.

$$\epsilon(\hat{G}(t), \hat{H}(t), t) =$$
$$\frac{1}{2}\sum_{i=1}^{t} \lambda_1^{t-i}\{V(i) - I(i)\hat{G}(t) - H(i)\}^2 + \frac{1}{2}\sum_{i=1}^{t} \lambda_2^{t-i}\{V(i) - I(i)G(i) - \hat{H}(t)\}^2$$

Here, V(i) is an $i^{th}$ voltage value, and I(i) is an $i^{th}$ current value. V(t) and I(t) are respectively a present voltage value and a present current value, and V(t−1) and I(t−1) are respectively an immediately preceding voltage value and an immediately preceding current value.

G(i) and H(i) are respectively actual values of an $i^{th}$ G parameter and an H parameter, and $\hat{G}(t)$ and $\hat{H}(t)$ are respectively a present value estimate of the G parameter and a present value estimate of the H parameter.

When a result obtained by differentiating the loss-function ε for $\hat{G}(t)$ and $\hat{H}(t)$ is 0, the loss-function ε is minimized for $\hat{G}(t)$ and $\hat{H}(t)$.

$\hat{G}(t)$ in which a result obtained by differentiating the loss-function ε for $\hat{G}(t)$ is 0 is obtained as follows.

$$\frac{\partial \epsilon}{\partial \hat{G}(t)} = 0$$

$$\sum_{i=1}^{t} \lambda_1^{t-i}(-I(i))\{V(i) - I(i)\hat{G}(t) - H(i)\} = 0$$

When the above equation is summarized, $\hat{G}(t)$ is as follows.

$$\hat{G}(t) = \frac{\sum_{i=1}^{t} \lambda_1^{t-i}\{V(k) - H(i)\}}{\sum_{i=1}^{t} \lambda_1^{t-i}I(i)^2}$$

$\hat{H}(t)$ in which a result obtained by differentiating the loss-function ε for $\hat{H}(t)$ is 0 is obtained as follows.

$$\frac{\partial \epsilon}{\partial \hat{H}(t)} = 0$$

$$\sum_{i=1}^{t} \lambda_2^{t-i}(-1)\{V(i) - I(i)G(i) - \hat{H}(t)\} = 0$$

When the above equation is summarized, $\hat{H}(t)$ is as follows.

$$\hat{H}(t) = \frac{\sum_{i=1}^{t} \lambda_2^{t-i}\{V(i) - I(i)G(i)\}}{\sum_{i=1}^{t} \lambda_2^{t-i}}$$

For real-time estimation, $\hat{G}(t)$ and $\hat{H}(t)$ obtained above are summarized in a recursive form by using the state vector $\hat{\Theta}(i)$ as follows.

$$\hat{\Theta}(t) = \begin{bmatrix} \hat{G}(t) \\ \hat{H}(t) \end{bmatrix} = \hat{\Theta}(t-1) + L(t) \times \left(V(t) - I(t)\hat{G}(t-1) - \hat{H}(t-1)\right)$$

Because the present voltage estimate $\hat{V}(t)$ is defined as $\hat{V}(t) = I(t)\hat{G}(t-1) + \hat{H}(t-1)$ and the voltage error e(t) is defined as e(t)=V(t)−$\hat{V}(t)$, the state vector $\hat{\Theta}(t)$ may be expressed as follows, as described above.

$$\hat{\Theta}(t) = \begin{bmatrix} \hat{G}(t) \\ \hat{H}(t) \end{bmatrix} = \hat{\Theta}(t-1) + L(t) \times e(t)$$

Here, the gain matrix L(t) and the covariance matrix P(t) are calculated as follows, as described above.

$$L(t) = \begin{bmatrix} L_1(t) \\ L_2(t) \end{bmatrix} = \frac{1}{1 + P_1(t-1)I(t)^2/\lambda_1 + P_2(t-1)/\lambda_2} \begin{bmatrix} P_1(t-1)I(t)/\lambda_1 \\ P_2(t-1)/\lambda_2 \end{bmatrix}$$

$$P(t) = \begin{bmatrix} P_1(t) \\ P_2(t) \end{bmatrix} = \begin{bmatrix} \{1 - L_1(t)I(t)\}P_1(t-1)/\lambda_1 \\ \{1 - L_2(t)\}P_2(t-1)/\lambda_2 \end{bmatrix}$$

Because an internal short-circuit cell detection method of the present embodiment uses a recursive method, only the present voltage value V(t), the present current value I(t), the state vector $\hat{\Theta}(t)$, and the covariance matrix P(t) may be stored in the memory 150. According to another example, the first forgetting factor $\lambda_1$ and the second forgetting factor $\lambda_2$ may be further stored in the memory 150. In addition, calculations are very simple, and calculations are possible even using the memory 150 having a small size of several kB. Because the state vector $\hat{\Theta}(t)$ and the covariance matrix P(t) are periodically updated, voltage and current fluctuations of each of the battery cells 111 may be reflected in the G parameter $\hat{G}(t)$ and the H parameter $\hat{H}(t)$ in real time.

The microprocessor 140 may repeatedly perform operations S120 through S150 in every time period Δt. When an internal short-circuit cell occurs in the battery cells 111, the microprocessor 140 may detect the internal short-circuit cell in real time.

According to the embodiment of FIG. 3, the G parameter Ĝ(t) and the H parameter Ĥ(t) may not be updated in every time period Δt.

As described above, the microprocessor 140 may compare the current difference ΔI with a certain range defined by the lower limit value ΔImin and the upper limit value ΔImax to determine whether the current difference ΔI is within the certain range (S113). The lower limit value ΔImin and the upper limit value ΔImax may be set according to a charging/discharging current pattern. The lower limit value ΔImin and the upper limit value ΔImax may be set based on a charge/discharge rate of the battery system 100. For example, the lower limit value ΔImin may be set to 0.2 C and the upper limit value ΔImax may be set to 1 C.

When the current difference ΔI is too small or too large, a sensing error between a voltage value and a current value causes a large deviation in the G parameter and the H parameter Ĥ(t) due to a recursive method. When the current difference ΔI is within the certain range, the method may proceed to operation S121 and the state vector Θ̂(t) and the covariance matrix P(t) may be updated based on the present voltage value V(t) and the present current value I(t). However, when the current difference ΔI exceeds the certain range, the method may return to operation S111 and the state vector Θ̂(t) and the covariance matrix P(t) may not be updated. That is, when the current difference ΔI exceeds the certain range, the present voltage value V(t) and the present current value I(t) do not affect the state vector Θ̂(t) and the covariance matrix P(t).

By updating the G parameter Ĝ(t) and the H parameter Ĥ(t) only when the current difference ΔI is within the certain range, the reliability of the G parameter Ĝ(t) and the H parameter Ĥ(t) may be maintained high.

A result obtained by measuring or estimating parameters of a normal battery cell and an internal short-circuit cell will now be described with reference to FIGS. 4 and 5.

Figure 4:
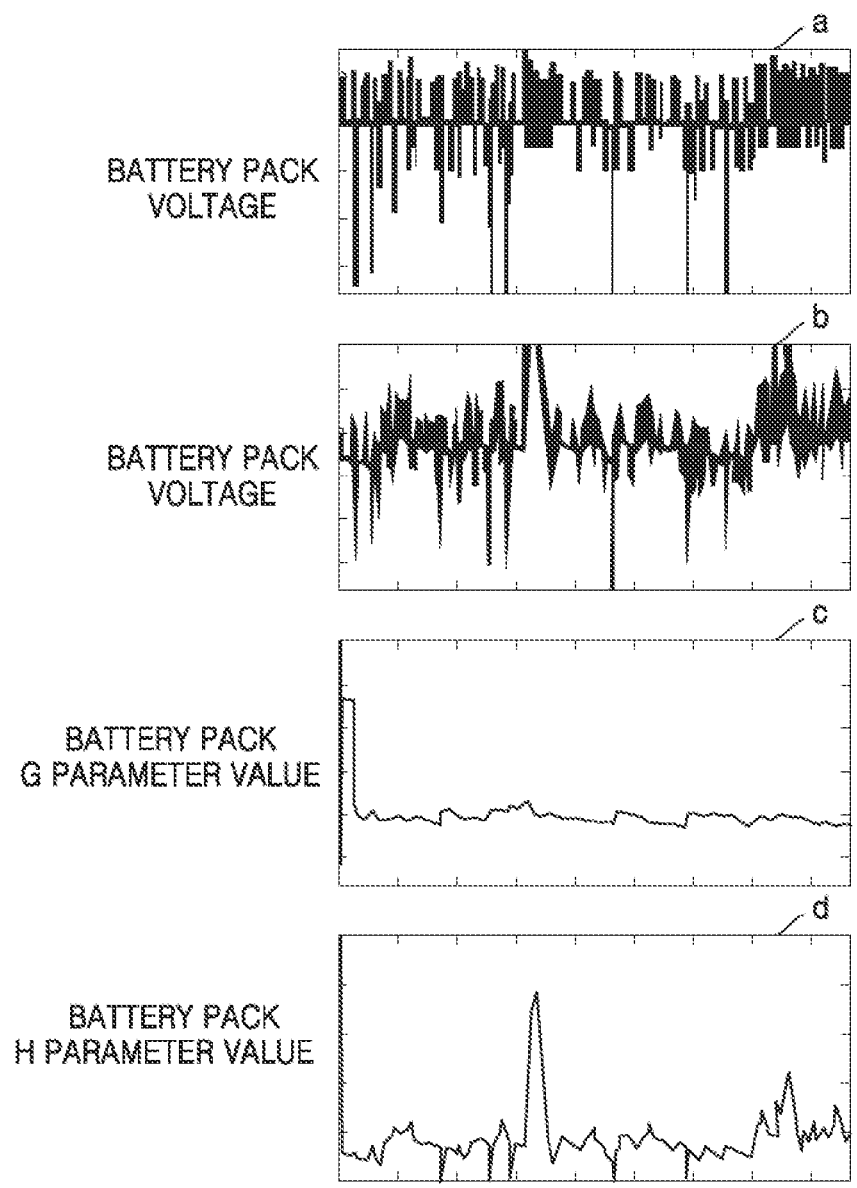
FIG. 4 illustrates parameter values measured and estimated in a battery pack including normal battery cells.

FIG. 4 shows graphs a through d respectively illustrating a battery pack current and a battery pack voltage measured in a battery pack including normal battery cells, and a G parameter value and an H parameter value estimated for the battery pack.

The graphs a through d of FIG. 4 use current/voltage actual operation pattern data of an energy storage system (ESS) of 20 Ah. Four battery cells were connected in series, and the time period Δt was 1 second. Current flowing through a normal battery cell is the same as battery pack current. The graphs a through d of FIG. 4 show a change in a specific parameter value according to time (seconds).

Figure 5:
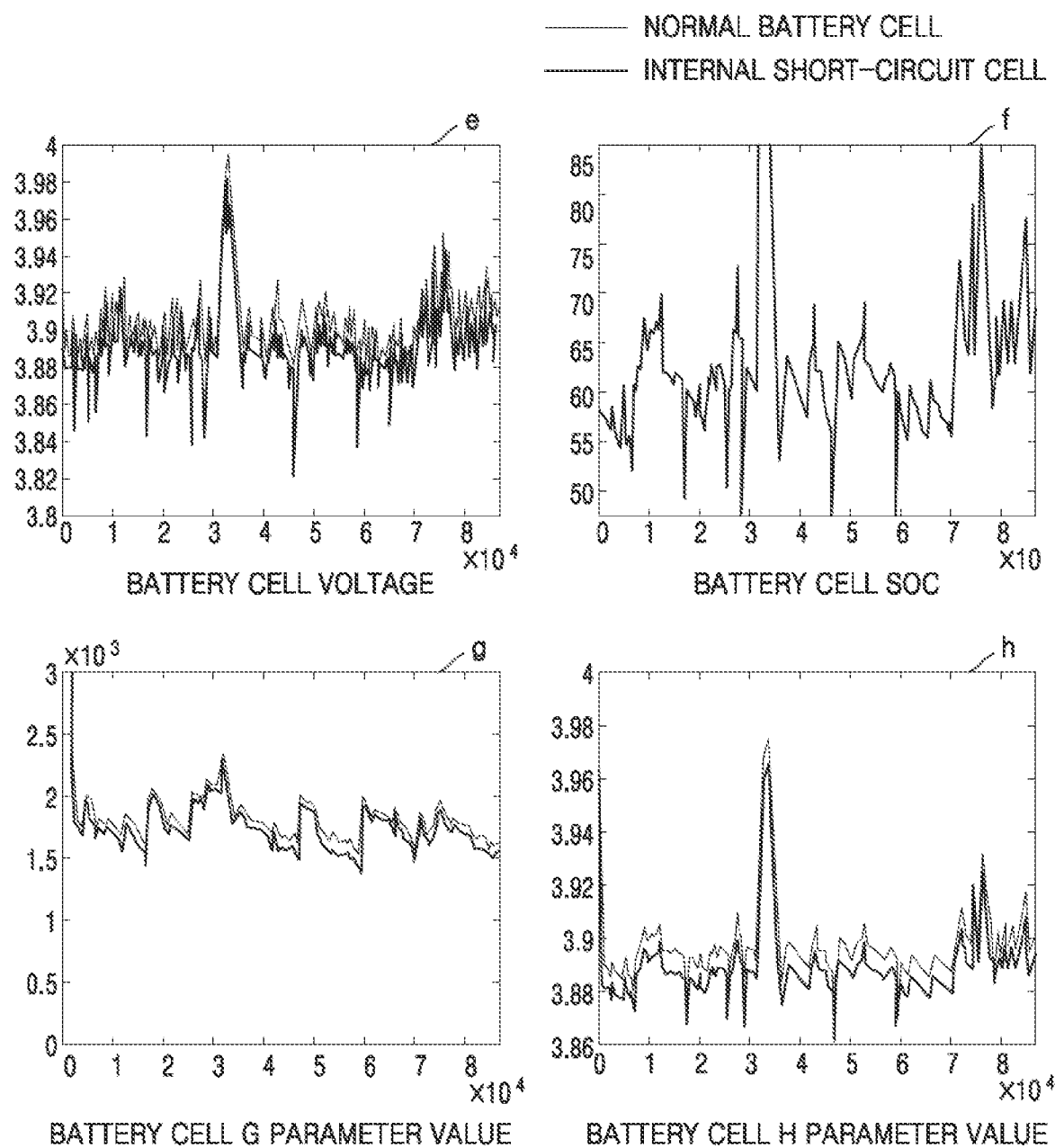
FIG. 5 illustrates a measurement or estimation result obtained after one normal battery cell is replaced with an internal short-circuit cell in the battery pack of FIG. 4.

FIG. 5 illustrates a measurement or estimation result obtained after one normal battery cell is replaced with an internal short-circuit cell in the battery pack of FIG. 4.

A graph e shows a battery cell voltage of each of a normal battery cell and an internal short-circuit cell, and a graph f shows a state of charge (SOC) of the battery cell. A graph g shows a G parameter value of each of the normal battery cell and the internal short-circuit cell, and a graph h shows an H parameter value of each of the normal battery cell and the internal short-circuit cell.

As shown in the graph g, the G parameter value of the internal short-circuit cell is less than the G parameter value of the normal battery cell. Also, as shown in the graph h, the H parameter value of the internal short-circuit cell is less than the H parameter value of the normal battery cell. That is, both the G parameter value and the H parameter value of the internal short-circuit cell are estimated to be less than those of the normal battery cell. Accordingly, a method of the present embodiment for determining whether a cell is an internal short-circuit cell based on a G parameter value and an H parameter value may be reliable.

The spirit of the present disclosure is not limited to the above-described embodiments, and all ranges equivalent to the claims or equivalently changed therefrom as well as the claims described below belong to the scope of the spirit of the present disclosure.

The invention claimed is:

1. An internal short-circuit cell detection method comprising:
    detecting a voltage and current of each of a plurality of battery cells that are electrically connected to one another between first and second terminals and are being used, to periodically generate a voltage value and a current value of each of the plurality of battery cells;
    updating in real time a G parameter value and an H parameter value obtained by digitizing a G parameter and an H parameter indicating a present state of each of the plurality of battery cells from the voltage value and the current value of each of the plurality of battery cells, by using an adaptive filter;
    calculating a G parameter representative value representing the G parameter values of the plurality of battery cells, and calculating an H parameter representative value representing the H parameter values of the plurality of battery cells; and
    determining whether a short circuit occurs in each of the plurality of battery cells, based on the G parameter value and the H parameter value of each of the plurality of battery cells, the G parameter representative value, and the H parameter representative value,
    wherein the G parameter is a parameter indicating a correlation of a voltage to a change in current for a corresponding battery cell of the plurality of battery cells, and
    the H parameter is a parameter indicating an effective potential of a corresponding battery cell of the plurality of battery cells, the effective potential being determined by a local equilibrium potential distribution and a resistance distribution in the corresponding battery cell.

2. The internal short-circuit cell detection method of claim 1, wherein the determining whether an internal short circuit occurs in each of the plurality of battery cells comprises:
    selecting a first battery cell that is one of the plurality of battery cells;
    calculating a G parameter deviation value of the first battery cell by subtracting a G parameter value of the first battery cell from the G parameter representative value;
    calculating an H parameter deviation value of the first battery cell by subtracting an H parameter value of the first battery cell from the H parameter representative value; and
    when the G parameter deviation value of the first battery cell is greater than a preset G parameter setting value and the H parameter deviation value of the first battery cell is greater than a preset H parameter setting value, determining that the first battery cell is an internal short-circuit cell.

3. The internal short-circuit cell detection method of claim 1, wherein the G parameter representative value is an average value of the G parameter values of the plurality of battery cells, and the H parameter representative value is an average value of the H parameter values of the plurality of battery cells.

4. The internal short-circuit cell detection method of claim 1, wherein the G parameter representative value is a median value of the G parameter values of the plurality of battery cells, and the H parameter representative value is a median value of the H parameter values of the plurality of battery cells.

5. The internal short-circuit cell detection method of claim 1, wherein the adaptive filter is a filter using a recursive least squares (RLS) method.

6. The internal short-circuit cell detection method of claim 5, further comprising:
initializing a plurality of state vectors and a plurality of covariance matrices respectively corresponding to the plurality of battery cells,
each of the plurality of state vectors comprises the G parameter value and the H parameter value of a corresponding battery cell from among the plurality of battery cells.

7. The internal short-circuit cell detection method of claim 6, wherein the periodically generating of the voltage value and the current value of each of the plurality of battery cells comprises:
selecting a first battery cell that is one of the plurality of battery cells;
generating an immediately preceding voltage value and an immediately preceding current value of the first battery cell; and
generating a present voltage value and a present current value of the first battery cell after a preset time period.

8. The internal short-circuit cell detection method of claim 7, further comprising:
calculating a current difference of the first battery cell between the present current value of the first battery cell and the immediately preceding current value of the first battery cell; and
comparing the current difference of the first battery cell with a preset range,
wherein, only when the current difference of the first battery cell is within the preset range, the G parameter value and the H parameter value of the first battery cell are updated by using the present voltage value and the present current value of the first battery cell.

9. The internal short-circuit cell detection method of claim 7, wherein the updating of the G parameter value and the H parameter value of each of the plurality of battery cells comprises:
calculating a present voltage estimate of the first battery cell, based on the present current value of the first battery cell and an immediately preceding value of the state vector corresponding to the first battery cell;
updating a gain matrix corresponding to the first battery cell and the covariance matrix of the plurality of covariance matrices corresponding to the first battery cell, based on the present current value of the first battery cell and an immediately preceding value of the covariance matrix corresponding to the first battery cell;
calculating a voltage error of the first battery cell between the present voltage value of the first battery cell and the present voltage estimate of the first battery cell; and
updating the state vector corresponding to the first battery cell, based on the immediately preceding value of the state vector corresponding to the first battery cell, a present value of the gain matrix corresponding to the first battery cell, and the voltage error of the first battery cell, to generate a present value of the G parameter of the first battery cell and a present value of the H parameter of the first battery cell.

10. The internal short-circuit cell detection method of claim 9, wherein the present voltage estimate of the first battery cell is calculated by adding an immediately preceding value of the H parameter of the first battery cell to a product of the present current value of the first battery cell and an immediately preceding value of the G parameter value of the first battery cell.

11. The internal short-circuit cell detection method of claim 9, wherein a present value of the state vector corresponding to the first battery cell is calculated by adding a product of the present value of the gain matrix corresponding to the first battery cell and the voltage error of the first battery cell to the immediately preceding value of the state vector corresponding to the first battery cell.

12. The internal short-circuit cell detection method of claim 9, wherein the updating of the gain matrix corresponding to the first battery cell and the covariance matrix corresponding to the first battery cell comprises applying a first forgetting factor related to the G parameter of the first battery cell and a second forgetting factor related to the H parameter of the first battery cell.

13. The internal short-circuit cell detection method of claim 12, wherein the gain matrix corresponding to the first battery cell is calculated according to $$L(t) = \begin{bmatrix} L_1(t) \\ L_2(t) \end{bmatrix} = \frac{1}{1 + P_1(t-1)I(t)^2/\lambda_1 + P_2(t-1)/\lambda_2} \begin{bmatrix} P_1(t-1)I(t)/\lambda_1 \\ P_2(t-1)/\lambda_2 \end{bmatrix},$$

and the covariance matrix corresponding to the first battery cell is calculated according to $$P(t) = \begin{bmatrix} P_1(t) \\ P_2(t) \end{bmatrix} = \begin{bmatrix} \{1 - L_1(t)I(t)\}P_1(t-1)/\lambda_1 \\ \{1 - L_2(t)\}P_2(t-1)/\lambda_2 \end{bmatrix},$$

wherein L(t) is the present value of the gain matrix corresponding to the first battery cell, L(t−1) is an immediately preceding value of the gain matrix corresponding to the first battery cell, P(t) is a present value of the covariance matrix corresponding to the first battery cell, P(t−1) is the immediately preceding value of the covariance matrix corresponding to the first battery cell, I(t) is the present current value of the first battery cell, $\lambda_1$ is the first forgetting factor, and $\lambda_2$ is the second forgetting factor.

* * * * *